United States Patent [19]

Cresswell et al.

[11] Patent Number: 5,383,136
[45] Date of Patent: Jan. 17, 1995

[54] ELECTRICAL TEST STRUCTURE AND METHOD FOR MEASURING THE RELATIVE LOCATIONS OF CONDUCTING FEATURES ON AN INSULATING SUBSTRATE

[75] Inventors: Michael Cresswell, Frederick; Richard Allen, Germantown; Loren Linholm, Ijamsville; Michael Gaitan, Gaithersburg, all of Md.

[73] Assignee: The United States of America as represented by the Secretary of Commerce, Washington, D.C.

[21] Appl. No.: 852,439

[22] Filed: Mar. 13, 1992

[51] Int. Cl.[6] .............................................. G01R 31/00
[52] U.S. Cl. .................... 364/561; 364/562; 324/716
[58] Field of Search ................ 364/561, 562, 563; 324/713, 714, 715, 716

[56] References Cited

U.S. PATENT DOCUMENTS

| 3,974,443 | 8/1976 | Thomas | 324/716 |
| 4,516,071 | 5/1985 | Buehler | 324/716 X |
| 4,672,314 | 6/1987 | Kokkas | 324/158 R |
| 4,810,335 | 3/1989 | Hieber | 204/192.33 |
| 4,918,377 | 4/1990 | Buehler et al. | 324/716 X |
| 4,983,908 | 1/1991 | Tada et al. | 324/158 P |
| 5,015,323 | 5/1991 | Gallagher | 156/345 |

OTHER PUBLICATIONS

Feldbaumer et al., "Design & Application of the Interlayer Van Der Pauw Resistor Alignment Bridge," IEEE Transactions on Semiconductor Manufacturing, vol. 3, No. 4, Nov. 1990.
Cresswell et al., "A Modified Sliding Wire Potentiometer Test Structure for Mapping Nanometer-Level Distances", IEEE International Conference on Microelectronic Test Structures vol. 4 No. 1 Mar. 1991.
Kuroki et al., "X-Ray Exposure Mask Accuracy Evaluation Using Electrical Test Structures", IEEE ICMTS vol. 4 No. 1 Mar. 1991.
Yen, D., et al. "A Cross Bridge Test Structure for Evaluating the Linewidth Uniformity of an Integrated Cirucit Lithography Sysetm", J. Electrochem. Soc.: Solid-State Science and Technology, vol. 129, No. 10, Oct. 1982, pp. 2313-2318.
Buehler, Martin G., et al. "The Split-Cross Bridge Resistor for Measuring the Sheet Resistance, Linewidth, and Line Spacing of Conducting Layers", IEEE Tranactions on Electron Devices, vol. ED-33, No. 10, Oct. 1986, pp. 1572-1579.

Primary Examiner—Jack B. Harvey
Assistant Examiner—Eric W. Stamber
Attorney, Agent, or Firm—Michael de Angeli

[57] ABSTRACT

A test structure for submicrometer metrology as used in integrated circuit manufacture comprises a bridge conductor divided into three segments by pairs of voltage taps. A first segment has no intermediate taps; a second segment has a number of dummy taps intermediate its ends; and a third segment has a single central tap, which may typically be formed in a different step than the remainder of the test structure, intermediate its ends. Preferably, the central tap extends from the same side of the bridge conductor as the taps at the ends of the third segment thereof. In order to evaluate a manufacturing operation, for example, to monitor the accuracy of registration of successive manufacturing steps, test signals are applied successively between the pairs of pads. Comparison of the response of the first and second segments to the test signals allows evaluation of the segment shortening effect of the taps; comparison of the response of the two portions of the third segment to the test signals allows evaluation of their lengths, and thus of the accuracy of registration of the step used to form the central tap.

6 Claims, 6 Drawing Sheets

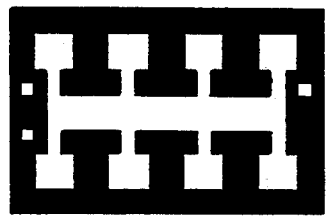
FIG. 1A (PRIOR ART)
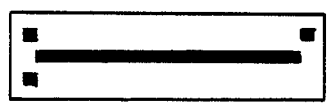
FIG. 1B (PRIOR ART)
FIG. 1C (PRIOR ART)
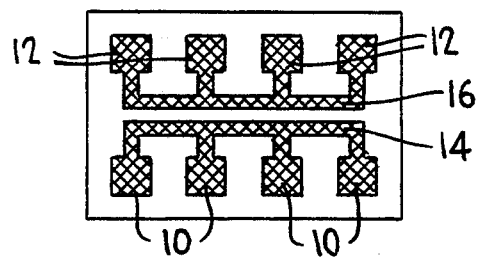
FIG. 2A (PRIOR ART)
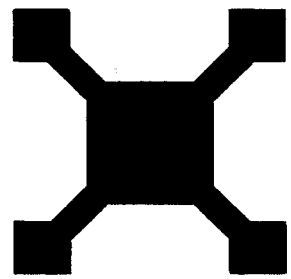
FIG. 2B (PRIOR ART)
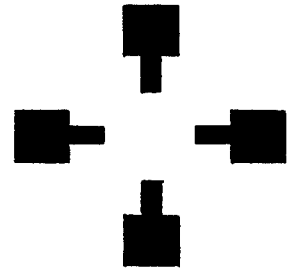
FIG. 2C (PRIOR ART)
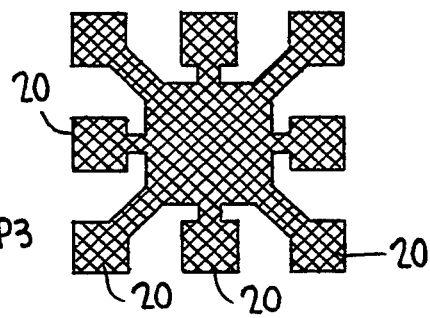
FIG. 3 (PRIOR ART)
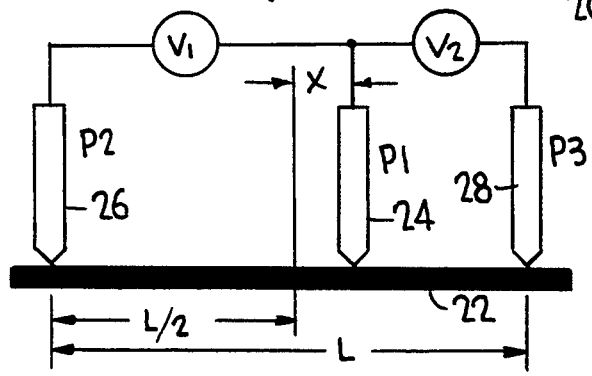
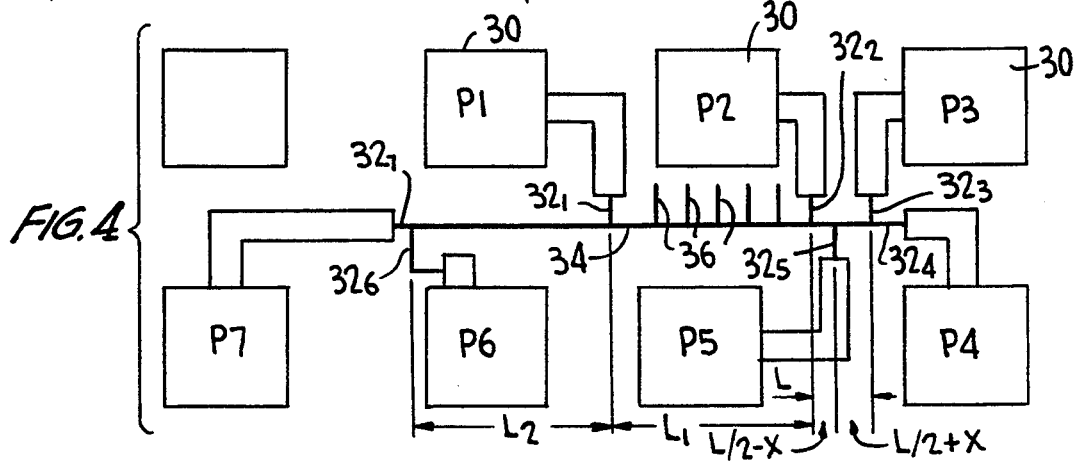
FIG. 4

ISIS

YAMA

MOATS

MOATS-X

ELECTRICAL TEST STRUCTURE AND METHOD FOR MEASURING THE RELATIVE LOCATIONS OF CONDUCTING FEATURES ON AN INSULATING SUBSTRATE

FIELD OF THE INVENTION

The present invention is directed to submicrometer feature placement metrology, for verifying patterns used in fabrication of semiconductor integrated circuits and the like. More particularly, the invention is directed to methods and structures for measuring the relative separation of conductive features formed in one or more manufacturing steps, while eliminating effects of systematic imperfections in test structures.

BACKGROUND OF THE INVENTION

As is well known, semiconductor manufacturing processes, as used to manufacture integrated circuits (ICs), involve a succession of fabrication operations requiring accurate registration of the tools used in each operation with the semiconductor wafer being processed. More specifically, successful semiconductor manufacturing requires highly accurate alignment of features on masks used in photolithographic processes, such that overlying successive mask-defined patterns of material are located on the wafer with precision in the low tens of nanometers range. Lithographic tools with such capabilities are being developed, but the metrology to routinely monitor and evaluate the performance of these new tools is lagging. Specifically, electrical test structures—that is, structures formed using the same tools and techniques used to manufacture the product of interest, but designed to have known and readily measurable characteristics, to allow evaluation of the manufacturing process—are needed. See Buehler et al U.S. Pat. Nos. 4,516,071 and 4,918,377, and Thomas U.S. Pat. No. 3,994,443, providing low-cost test structures for evaluating the accuracy of manufacturing steps during the advanced stages of process development and during manufacturing. However, the test structures shown in these documents are inadequate to meet current needs.

There are three principal classes of applications of test structures of interest here. In a first class of application, where the test structure is used for evaluation of accuracy of pattern generation feature placement, the entire test structure is replicated in a single conducting film on the substrate after it is imaged by a steered beam and then developed in an overlying resist film. When, for example, the serial printing of the features of the test structure during manufacture is interrupted by repositioning of the workpiece with respect to the printing equipment, the test structure allows the evaluation of the accuracy of placement of the features printed prior to the interruption with respect to those printed subsequently. The extracted relative placement of local features enables comparison with their specified relative placement. This comparison provides a significant figure of merit for pattern generation tool performance evaluation.

In a second class of applications, where the test structure is used to evaluate overlay extraction for tool alignment capability evaluation, and for mapping the local overlay mismatch of features on a pair of masks, two different complementary patterns, together constituting the test structure, are exposed with the same tool into the same single resist film prior to development of the composite image and its replication in an underlying conducting film. The test structure enables measurement of any local mismatch in the overlay of the two exposures. If, for example, the two exposures are made using two respective masks, and the contributions to the observed overlay mismatch originating in the patterning of the masks are known or are insignificant, then the tool alignment performance may be extracted. Conversely, when the tool-induced contribution to mismatch is insignificant or is separately extracted, then the local overlay mismatch of the two masks can be measured. When the location of features in the resist by the first mask defines a reference grid, overlay mapping then enables the evaluation of feature placement on the second mask, which may be an x-ray lithography reticle, for example.

A third class of applications, where the test structure is used for mapping the local overlay of two levels in a standard or nonstandard IC wafer fabrication process, involves measurement of the alignment of features on a mask to those on a substrate that is pre-patterned with a conducting film. An important application is measuring the alignment of vias (i.e., holes extending through a substrate or the like) with respect to an underlying metal interconnect layer. The process used to fabricate the test structure typically includes at least two separate etch and two separate photolithographic steps. However, the entire test structure may still be replicated in a single conducting film which is patterned twice. See J. J. LaBrie, B. Fay, M. A. Blanco, K. M. Monahan, J. T. Chen, D. F. Kyser, "Characterization of Two Level Overlay in X-Ray/Optical Stepper Mix and Match Lithography", SPIE Vol. 775, *Integrated Circuit Metrology, Inspection, and Process Control*(1987).

The prior art includes numerous electrical test structures useful in one or more of the classes of applications described above. A first type of electrical test structure, termed the "differential linewidth bridge" or "cross-bridge resistor" has been used for measurement of electrical linewidth. See U.S. Pat. Nos. 3,974,443 to Thomas, and 4,516,071 to Buehler, and M. G. Buehler, S. D. Grant, and W. R. Thurber, "Bridge and van der Pauw Sheet Resistors for Characterizing the Linewidths of Conducting Layers", *J. Electrochem. Soc.*, Vol. 125, pp. 650–654 (1978). Using a differential linewidth bridge for overlay measurement enables the extraction and mapping of the local overlay of two patterns from the difference in linewidth of a pair of closely separated, parallel, linear features. The respective features are replicated on the substrate by splitting lengthwise, with a second exposure, a single linear feature defined by a first exposure.

An example of the steps used in forming such a split bridge test structure is shown in FIG. 1. FIG. 1(a) shows a first pattern, e.g., used to form conductive material on a substrate. FIG. 1(b) shows a second similar pattern used similarly. If the two patterns are properly aligned, the pattern of FIG. 1(c) results. To test the relative alignment, currents can be forced between the conductive pads 10 of the lower pattern and 12 of the upper pattern by applying test voltages therebetween. If the two exposures were properly aligned, the conductors 14 and 16 connecting the pads 10 and 12, respectively, will be of equal width, and hence will conduct equal current.

Using this technique, Y. Kuroki, S. Hasegawa, T. Honda, and Y. Iida, "X-ray Exposure Mask Accuracy Evaluation Using Electrical Test Structures" *Proc IEEE International Conference on Microelectronic Test Structures*, Vol. 4, No. 1, 123–127, March 1991 report resolutions of better than 100 nm in overlay metrology in double mask processing. B. Fay and T. Hasan, "Electrical Measurement Techniques for the Characterization of X-Ray Lithography Systems" *Solid State Technology*, pp. 239–243 May 1986 and C. J. Ashton, "Differential Linewidth Structures for Overlay Measurements at 0.25 Micron Ground Rules", SPIE Vol. 775 *Integrated Circuit Metrology, Inspection and Process Control*, p. 201 (1987) demonstrate equally impressive results in a single conducting film.

However, there are limitations on use of this technique. Its use for the first class of applications discussed above is technically cumbersome, and it is process-incompatible with the third class of applications. Of course, it may still be used in multilevel applications where a nonstandard IC fabrication process sequence is acceptable. The differential linewidth bridge technique can also be used to evaluate manufacturing techniques in the second class of applications discussed above, although there the two complementary patterns must be imaged in positive resist.

A second significant limitation of the differential linewidth bridge technique is that the evaluation of the accuracy of placement, that is, the accuracy of the overlay of successive operations, is only as accurate as the linewidth measurement. More specifically, in conductors having smaller dimensions, the distinction between the actual or "physical" linewidth of a tap connected to a principal conductor and its measured or "electrical" linewidth becomes significant. In uniform films, the correspondence between physical and electrical linewidths tends to be very good even into the submicrometer region. It is not necessary to use test structures having submicrometer geometries when measuring comparative linewidths for the purpose of determining overlay. In fact, submicrometer linewidths may actually be deleterious in this application because what is actually extracted in a linewidth bridge measurement is the average electrical linewidth along the length of the bridge. This length is typically at least 100 $\mu$m. The relationship of this extracted average to the variation in the actual local linewidth at different points along its length, as a consequence of material and/or processing nonuniformities, is significant. The smaller the area occupied by the test structure, the more sensitive is the extracted measurement to the effective spatial resolution. That is, the accuracy of a measurement of overlay mismatch in, for example, the x-direction, made using the differential linewidth technique, is affected by any mismatch in the y-direction. Further, the effect of mismatches in one dimension on measurements of mismatches in the other dimension increases with the minimum size of the basic structure.

A second well-known test structure used in evaluation of IC manufacturing techniques is the van der Pauw bridge shown in FIGS. 2(a)–(c). As in the case of the differential linewidth bridge of FIGS. 1(a)–(c), FIGS. 2(a) and (b) show two patterns printed in successive operations. If they are aligned correctly, the symmetrical structure of FIG. 2(c) is formed in conductive material. Its symmetry can be determined by forcing currents between various pairs of the pads 20; if uniform current flows between each pair, the two exposures were properly aligned.

Until recently, the van der Pauw resistor alignment bridge shown in FIGS. 2(a)–(c) had been used exclusively in the first and second classes of applications in which the complementary patterns were sequentially imaged in negative resist, that is, at least when the conducting film was patterned by etching. See D. S. Perloff, "A Van der Pauw Resistor Structure for Determining Mask Superposition Errors on Semiconductor Slices" *Solid State Electronics* 21, pp. 1013–1018 (1978). However, a more current paper has reported on the extension of its use to a multilevel structure of the third class of application. D. W. Feldbaumer, C. J. Varker, M. Griswold, and B. J. Allen, "Design and Application of the Interlayer van der Pauw Resistor Alignment Bridge" *IEEE Transactions on Semiconductor Manufacturing*, Vol. 3, No. 4, pp. 206–215, November 1990. In all applications, the van der Pauw bridge offers compactness of the active area for pairs of measurements in both coordinate directions. Another advantage is that the multilevel implementation is fully IC process-compatible.

However, the absolute accuracy and precision provided by the van der Pauw bridge are comparable to that provided by other techniques only when applied to films of relatively high sheet resistivity $\rho_s$. In particular, in-depth analyses provided by Perloff, supra, suggest that $\rho_s$ greater than 100 $\Omega$/sq may be necessary to reduce measurement uncertainties to below about 20 nm, for example. Both sensitivity (mV/$\mu$m) and accuracy degrade as $\rho_s$ decreases. Accordingly, the application of this structure to the low sheet resistivity films used for interconnect metal could be quite difficult.

FIG. 3 reviews the salient features of the basic architecture of a third principal type of known test structure, the voltage-dividing potentiometer disclosed in D. R. Thomas and Richard D. Presson, "An Electrical Photolithographic Alignment Monitor", *Digest of Papers, Government Microcircuit Applications Conference*, pp. 196–197 (1974) and T. J. Russell, T. F. Leedy, and R. L. Mattis, "A Comparison of Electrical and Visual Test Structures For Evaluating Photomask Alignment in Integrated Circuit Manufacturing", *Technical Digest IEDM*, Washington, DC, pp. 1–3, Dec. 5–7, 1977. Such a potentiometer provides a measurement of the displacement of a central "tap" or probe P1 between two end taps P2 and P3. If P1 is formed in a separate operation than that used to form P2 and P3, the potentiometer provides an indication of the accuracy of the alignment of the operation.

The basic test structure architecture shown in FIG. 3 is referred to herein as the "classical" voltage-dividing potentiometer. The Thomas et al and Russell et al papers, supra, describe the performance of such potentiometer-based test structures. In both cases, the reported measurement uncertainties were approximately 100 nm.

The classical voltage dividing potentiometer provided by FIG. 3 is used by forcing a current to flow between the ends of a "bridge conductor" 22, and measuring the voltage drops $V_1$ and $V_2$ between pairs of taps 24 and 26, and 24 and 28, respectively. Comparison of $V_1$ and $V_2$ indicates the relative resistance of the corresponding portions of the segment of bridge 22 between taps 26 and 28 and hence of their relative length. The "offset" x of the probe P1 as it "slides" along the bridge conductor 22, relative to the midpoint between probes P2 and P3, is determined from the linear relationship between the voltage drops $V_1$ and $V_2$, and the distances x and L, as a test current is forced through the bridge, according to:

$$x = \left(\frac{V_1 - V_2}{V_1 + V_2}\right)\left(\frac{L}{2}\right) \quad (1)$$

When the structure is implemented on IC wafers (for example), the probe P1 is referred to as the "center" tap 24, and the probes P2 and P3 are referred to as "end" taps 26 and 28. The center-to-center spacing of taps 26 and 28, L, serves as the "ruler" for the measurement of x, the "offset" of the probe P1 from the midpoint of probes P2 and P3.

The voltage-dividing potentiometer, including the enhanced version according to the invention that is described below, is readily implemented for the first, second and third classes of applications.

In order that measurements made using a voltage dividing potentiometer and analyzed according to Eq. (1) can provide a correct measurement for the offset x, in order to evaluate correctly the accuracy of registration of successive manufacturing operations (for example), the taps must be electrically connected to the bridge at point contacts. If the taps are not thus connected to the bridge by point contacts, systematic errors in the extracted value of x will result from an effective shortening of the electrical bridge length due to the finite width of the contact region connecting the taps to the bridge. The bridge can be made sufficiently long that the tap contacts are essentially point contacts relative to the bridge's length. In this limiting case, the quantity L may be approximated by Eq. (1) as the design value of the center-to-center separations of the end taps. However, when this approach is taken, random errors resulting from the extended length of the bridge, combined with micro-scale variations of the test structure composition and geometry and voltage measurement noise, limit the classical voltage-dividing potentiometer to about 0.1 μm resolution. Further, in many circumstances it is impractical to significantly extend the bridge conductor 22 to provide a large value for L.

OBJECTS OF THE INVENTION

Therefore, it is a principal object of the present invention to provide a metrology tool that provides measurement of feature placement to within 10 nanometers employing conventional fabrication techniques and test equipment.

Another object of the present invention is to provide a test structure useful in evaluating multilevel registration applications.

Finally, another object of the present invention is to provide an improved process and test structure for extracting the separation of parallel features at the 10 nm level, and specifically to provide means for eliminating substrate-dependent systematic errors in an electrical test structure.

SUMMARY OF THE INVENTION

A first aspect of the present invention involves a modified sliding wire potentiometer, again featuring a center tap extending from a conductive bridge between end taps extending from the bridge. A number of dummy taps are also provided in an adjoining segment of the bridge, to allow the measurement of the effect of finite tap width, and compensation therefor. This structure permits measurement of the lateral placement of the center tap relative to the end taps with residual errors typically less than 15 nanometers.

It was further discovered by the inventors that certain systematic errors characteristic of the substrate on which the test structures are replicated could be attributed to imperfections at the inside corners of the intersections of the voltage taps with the bridge.

Therefore, according to a further aspect of the invention, the taps of the sliding-wire potentiometer all extend from the same side of the bridge. Systematic errors resulting from "inside-corner rounding" where the taps meet the bridge are eliminated by this improvement. The result is a feature placement metrology tool that provides measurement of feature placement to within 10 nanometers, eliminating the systematic errors discussed above, and which can be implemented using conventional fabrication techniques and test equipment.

More specifically, the test structure according to the invention comprises a bridge conductor divided into 3 segments by pairs of voltage taps. A first segment has no intermediate taps; a second segment has a number of dummy taps intermediate its ends; and a third segment has an additional single central tap, which may be formed in a different operation than the remainder of the test structure, intermediate its ends. Preferably, the central tap extends from the same side of the bridge conductor as the taps at the ends of the third segment thereof. In order to evaluate a manufacturing operation, for example, to monitor the accuracy of registration of a subsequent step with respect to prior steps, test signals are applied successively between the pairs of pads. Comparison of the response of the first and second segments to the test signals allows evaluation of the segment shortening effect of the taps; comparison of the response of the two portions of the third segment to the test signals allows evaluation of their length, and thus of the accuracy of registration of the step used to form the central tap.

BRIEF DESCRIPTION OF THE DRAWINGS

Other objects and advantages of the invention will become apparent upon reading the following detailed description and upon reference to the drawings, in which:

FIGS. 1(a)–(c), diagrammatically illustrate prior art techniques of differential linewidth bridge measurement;

FIGS. 2(a)–(c) diagrammatically illustrate a prior art van der Pauw resistor alignment bridge;

FIG. 3 is a diagrammatic illustration of a prior art voltage-dividing potentiometer;

FIG. 4 is a diagrammatic illustration of a first embodiment of test structure according to the invention;

DESCRIPTION OF THE PREFERRED EMBODIMENT

Figure 5A:
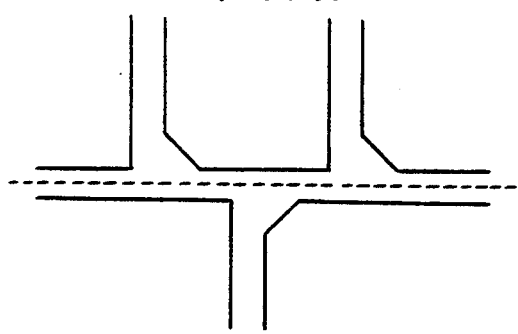
FIGS. 5(a) and (b) provide diagrammatic illustration of examples of flipwise symmetrical and unsymmetrical uneven inside corner rounding (ICR)

According to one aspect of the invention, uncertainty in the measurement of the respective effective equivalent lengths of bridge conductor segments on either side of a central tap due to the finite width of taps connected to the bridge conductor is reduced; according to a second aspect of the invention, systematic errors that originate in certain common design practices are simultaneously eliminated. The first of these benefits is obtained by measuring the line-shortening effect $\delta L$ due to a single tap and using $\delta L$ to correct the physical center-to-center separation of the end taps L, thus determining the effective equivalent value of bridge length, for use in Eq. (1). Other measurements are then accordingly corrected. The bridge length L then no longer needs to be very long compared to the tap width, but can be made short enough to minimize random linewidth errors, and increase the sensitivity of the measurements made. The second benefit is obtained by proper arrangement of the taps used to connect the test signals to the bridge conductor.

After the line-shortening effect $\delta L$ has been determined, the length L of the conductor segment can be corrected, such that the value of the offset x in FIG. 3 is given by $$X = \left(\frac{V_1 - V_2}{V_1 + V_2}\right)\left(\frac{L - 2\delta L}{2}\right) \tag{2}$$

Accurate determination of the offset x allows evaluation of the accuracy of manufacturing operations, in accordance with the objects of the invention.

FIG. 4 shows a test structure design allowing determination of $\delta L$ according to a first aspect of the invention. The enhanced voltage dividing potentiometer test structure shown in FIG. 4 includes a number of pads 30, numbered $P_1$-$P_7$, and connected by conductive taps $32_1$-$32_7$ to a bridge conductor 34. In a typical use of the test structure of FIG. 4, the bridge conductor 34, pads $P_1$-$P_4$, $P_6$, and $P_7$ and their associated tabs $32_{1\text{-}4}$, $32_6$, and $32_7$ are formed in a first operation, while pad $P_5$ and tap $32_5$ are formed subsequently.

The goal of the test structure is to allow objective determination whether tap $32_5$ is properly registered with respect to the taps formed earlier. This can be determined by measuring the respective distances along the bridge conductor between the intersection of the taps $32_4$ and $32_6$, and the intermediate tap $32_5$. That is, if the tap $32_5$ is centered between taps $32_4$ and $32_6$, it can be concluded that the two fabrication steps were, in fact, carried out in proper registration. This use of the structure of FIG. 4 is identical to the practice of the prior art, e.g., using the structure of FIG. 3. However, as noted above, the prior art length measurements are distorted by a "line-shortening" effect caused by the finite widths of the taps; in effect, the taps reduce the local resistance of the bridge conductor, distorting measurements of its length carried out by measuring its response to test currents forced along the bridge.

According to an important aspect of the invention, the distortion in the voltage measurements caused by the finite width of taps 32 can be compensated for by adding a number of "dummy taps" 36 and measuring the effect of these on the measured length of the conductor 34. More specifically, the current-carrying ability of the conductor is distorted by the dummy taps 36 in a manner analogous to the effects of the taps 32 on the conductivity of the conductor 34. The structure of FIG. 4 allows the calculation of a length-shortening factor $\delta L$, using the following equation:

$$\delta L = \frac{L_1 V_{P1-P6} - L_2 V_{P2-P1}}{((n + 1)V_{P2-P1}) - V_{P1-P6}} \tag{3}$$

where n is the number of "dummy" taps between taps $32_1$ and $32_2$, $L_1$ is the design length between taps $32_1$ and $32_2$, $L_2$ is the design length between taps $32_1$ and $32_6$, and $V_{P1-P6}$ and $V_{P2-P1}$ are the voltages measured between the corresponding pads responsive to a given test current forced between the pads $P_4$ and $P_7$.

Therefore, according to one significant aspect of the invention, the fact that the taps are of finite width can be compensated for in determining x by incorporating dummy taps into the design and determining $\delta L$ using the equations above. It can thus be seen that the FIG. 4 structure according to the invention provides very significant and useful results.

The inventors' experimentation with the structure of FIG. 4 indicated that while random residual errors tended to be present in the measurements of the relative offsets from a particular substrate, typically 5-15 nm, a superposed systematic error of up to 100 nm that was constant for a particular substrate but varied from one substrate to another was also noted. The latter is referred to as the Substrate Dependent Systematic Error (SDSE), and is not to be confused with the systematic error resulting from low ratios of bridge length to voltage tap contact width, which is successfully addressed by the modified potentiometer architecture according to the invention, which is presented in FIG. 4.

By comparison, SDSE is now known to depend on the preparation of the substrate and is only present to the extent that aspects of the pattern as produced do not exactly conform to the structure as designed.

The inventors have formed a model for the origin of SDSE, simulated the effects it produces, and have found the results of the simulations to match observations and measurements. Accordingly, the invention includes further improvements on the modified voltage-dividing potentiometer presented in FIG. 4, eliminating SDSE.

Figure 7:
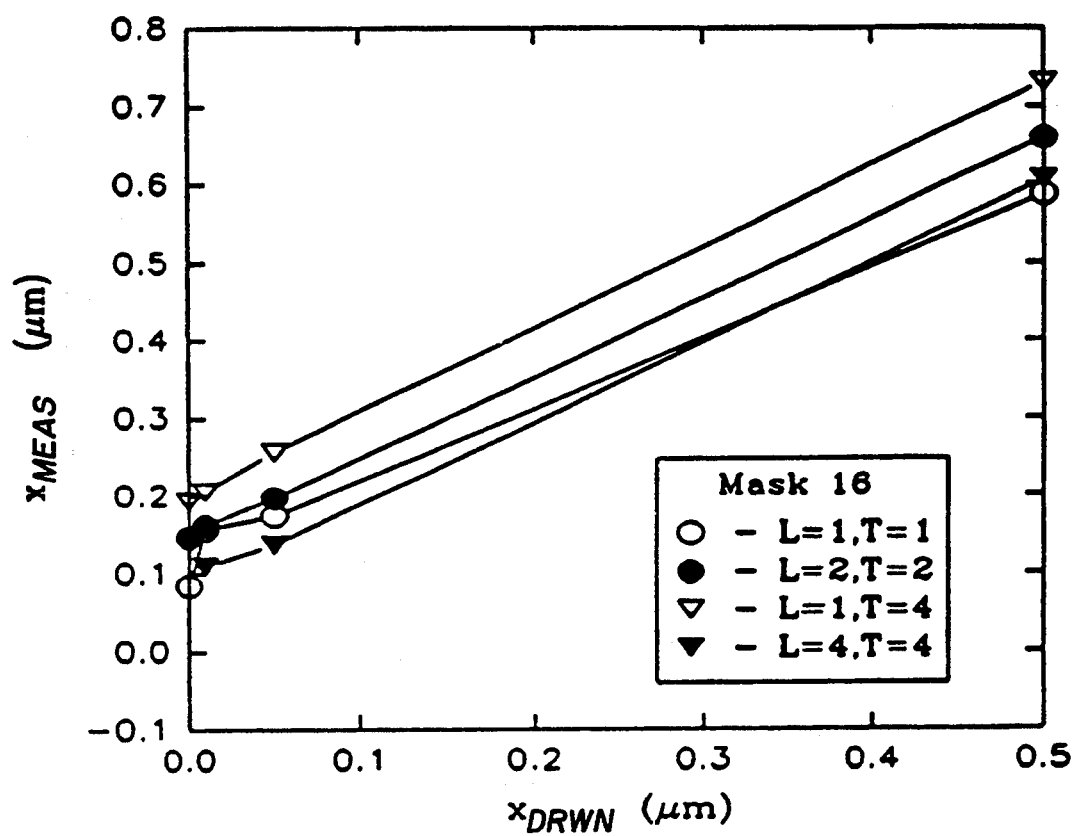
FIG. 7 is a graph showing data determined in testing the structure of FIG. 4.
Figure 8:
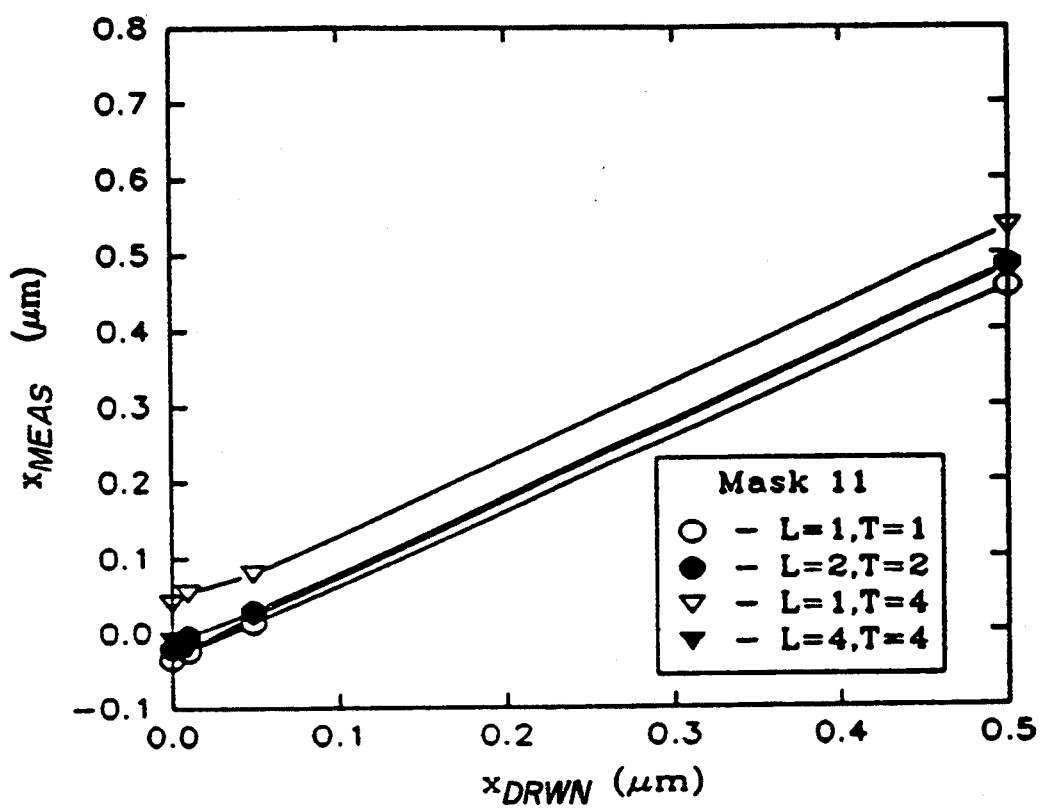
FIG. 8 is a graph comparable to FIG. 7 of data from a second similar test.

FIGS. 7 and 8 show data obtained by measurements carried out on two test structures corresponding to that shown in FIG. 4. FIGS. 7 and 8 graph a number of measured offsets "$X_{MEAS}$" (the departure of a tap $32_5$ in FIG. 4 from the nominal or design location centered between taps $32_4$ and $32_6$) versus a variety of designed-in values for the offset ("$X_{DRWN}$") to determine whether the test structure of FIG. 4 did in fact allow accurate determination of x. As can be seen from examination of FIGS. 7 and 8, while $X_{MEAS}$ generally varies linearly with $X_{DRWN}$, the two structures exhibited markedly different errors.

Figure 6:
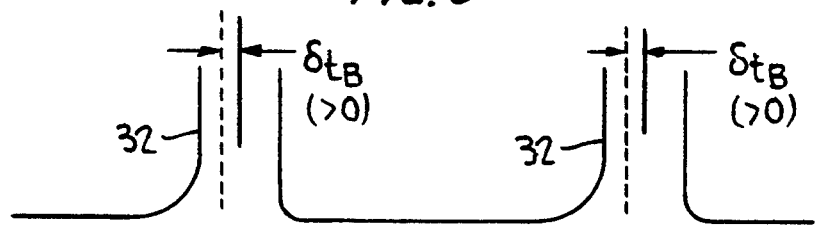
FIG. 6 a diagrammatic illustration of the terminology used in explaining the invention.

The structures from which the measurements shown in FIGS. 7 and 8 were extracted were fabricated on a single layer, and in a single pass, by a state-of-the-art electron beam primary pattern generator operating essentially accordingly to the first class of applications identified above. Therefore, actual misplacements of the center taps between the end taps of the magnitudes observed was considered highly unlikely. It was hypothesized, and subsequently confirmed by the inventors, that small variations in the magnitude and orientations of Inside Corner Rounding (ICR) occurring where the taps meet the bridge accounted for the observed effects. Specifically, the test results suggested the hypothesis that the inside corners were characterized by uneven ICR, translational symmetry, and flipwise asymmetry. FIGS. 5(a) and (b) (discussed below) show examples of these systematic defects, while FIG. 6 illustrates parametric representations used to develop mathematical models thereof.

More specifically, a test chip containing a number of test structures based on the modified voltage-dividing potentiometer shown in FIG. 4 was designed and printed on a master chrome plate at 10X by a MEBES-76 electron beam system with 0.1 $\mu$m by 0.1 $\mu$m pixel size. The master was then stepped across working masks at 10X reduction and 10-mm stepping distances with an optical tool providing a series of designed-in or "drawn" offsets, $X_{DRWN}$, of 0, 10, 50 and 500 nm in a selection of test structures in each of a 10 by 10 array of chips. Two different test structures were then fabricated using this test chip, and were installed on a dc parametric tester for measurement extraction. The first test structure mask ("Mask 16") was of antireflective chrome, and the second ("Mask 11") of bright chrome.

FIGS. 7 and 8 are plots of $X_{MEAS}$, calculated using Eq. (4) and averaged over four mask sites, versus $X_{DRWN}$, for masks 16 and 11, respectively. Partial validation of the electrical length shortening effect of attached voltage taps, represented by Eq. (3), is illustrated; that is, the results shown in FIGS. 7 and 8 indicate that as $X_{DRWN}$ and $X_{MEAS}$ are linearly related, $\delta L$ is in fact consistent for a given device. More specifically, the slope of each of the lines is very close to unity, indicating that the measured offset $X_{MEAS}$ scales almost exactly linearly with the design offset $X_{DRWN}$.

Significant nonzero y-axis intercept values in FIGS. 7 and 8 remain to be explained. For Mask 16, as shown in FIG. 7, the intercepts are in the range of 0.1 to 0.2 $\mu$m, while for Mask 11, as shown in FIG. 8, the y-intercepts are clustered around the origin. It has been discovered by the inventors that the observed intercepts are in fact substrate-dependent systematic errors (SDSE), i.e., errors in the apparent location of the offset of the center tap relative to the end taps, caused by a subtle flaw of the pattern replication process.

It was hypothesized by the inventors that the nonzero y-intercepts of the data graphed in FIGS. 7 (in particular) and 8 were due to the effects of inside corner rounding of the tap-to-bridge intersections introduced in the working mask replication process. There are two effects that inside corner rounding could have on the extracted measurement of x which would cause an apparent misplacement of the center tap consistent with the observed SDSE effects. The first occurs when the taps attached to opposite sides of the bridge are of different electrical widths at their intersections with the bridge. In this case a single value of $\delta L$, extracted from taps on one side of the bridge only, does not adequately describe the bridge length shortening effect. The second occurs if the tap-to-bridge inside corners are rounded so as to displace the effective electrical centers of the taps in an asymmetrical manner, for example, to displace the electrical centers of the taps on different sides of the bridge in different directions, or nonuniformly in the same direction. The net effect is to move the electrical center of the center tap relative to the electrical centers of the end taps. It should be emphasized that inside corner rounding per se does not render sliding wire potentiometer metrological techniques unworkable; when these effects are understood, they can be compensated for in the initial design.

Figure 5B:
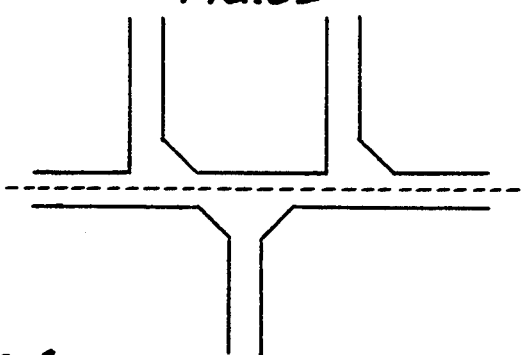

A high-powered optical microscope was used to examine the extent of visible inside corner rounding, and indicated that while ICR typically varied with the corner's orientation, the ICR detected at particular tap-to-bridge intersections on the same side of the bridge and the same side of the tap appeared to be the same. That is, translationally equivalent corners had the same magnitude of corner rounding, but the corner rounding at each orientation was typically different from that at any other orientation. FIG. 5(b) gives an example of typical corner rounding found on Mask 16. Note that the ICR differed on opposite sides of the bridge conductor—that is, the ICR was flip-wise asymmetrical. Eq. (2) does not provide correct results in this case. As to Mask 11, although there was prominent ICR (as illustrated in FIG. 5(b), the ICR in this case was flipwise symmetrical, such that Eq. (2) is accurate. The comparatively increased asymmetry of the Mask 16 pattern shown in FIG. 5(b) is understood to explain qualitatively the greater value for the y-intercepts observed in the data graphed in FIGS. 7 as compared to the Mask 11 data graphed in FIG. 8.

FIG. 6 illustrates the terminology used by the inventors in parameterization of the inside corner rounding effect in order to quantify the same. As can be seen in FIG. 6, when the magnitude of inside corner rounding is different on opposite inside corners of the same tap-to-bridge intersection, for example on lower side A of the bridge 34, the effective electrical center of the intersection, i.e., the "centerline" of current flowing along the bridge (shown by a dotted line), is displaced laterally from the geometrical centerline of the tap (shown by a solid line) by a distance $\delta t_A$. A similar effect in the opposite direction is exhibited on the upper side B of the conductor, parametrized as $\delta t_B$. The presence of the tap results in an effective shortening of the bridge length L by amounts $\delta L_A$ and $\delta_B$. Of course, the metrological objective is accurate measurement of the center-to-center separation of the extended tap line geometries, rather than that of their effective electrical centers at their respective intersections with the bridge. As long as each of any pair of taps has equal $\delta t$ values, the lateral separation of the electrical centers of their intersections with the bridge is equal to the geometrical center-to-center separation of their extended lengths. This condition is expected to prevail in general as a consequence of the local translational symmetry of the feature replication process (e.g., as in FIG. 5(a)) thus rendering Eq. (2) valid. On the other hand, if each of a pair of taps have different inside corner rounding, they will have different electrical displacement values. For example, the taps on the A side of the bridge of FIG. 6 will exhibit electrical displacement with respect to the taps on the B side of the bridge; the electrical separation of the intersections will generally be different from their corresponding geometrical spacing by, in this case, the amount $\delta t_A - \delta t_B$.

However, as noted above, inside corner rounding is only one of two contributors to the systematic error to which the (nonenhanced) modified design in FIG. 4 is vulnerable. In addition to correcting appropriately for this source of error, respective measures of the bridge-shortening parameters $\delta L$ must also be extracted from dummy taps on respective sides of the bridge and used appropriately in the calculation of x.

In summary, Eq. (2) does not give a correct value for $X_{MEAS}$ unless both $\delta t_A = \delta t_B$ and $\delta L_A = \delta L_B$. When $\delta t_A \neq \delta t_B$ or $\delta L_A \neq \delta L_B$, differential displacement and differential bridge-length shortening, respectively, will exist. The offset x is then correctly given by $$X_{MEAS} = \left(\frac{V_1 - V_2}{V_1 + V_2}\right)\left(\frac{L - (\delta L_A + \delta L_B)}{2}\right) + (\delta t_A - \delta t_B) \quad (4)$$

If respective differential quantities $\Delta t$ and $\Delta L$ are defined such that $\delta t = \delta t_A - \delta t_B$ and $\delta L = \delta L_A - \delta L_B$, and if $\delta L$ is used to denote $\delta L_A$, then Eq. (4) becomes $$X_{MEAS} = \quad (5)$$

$$\left(\frac{V_1 - V_2}{V_1 + V_2}\right)\left(\frac{L - 2\delta L}{2}\right) - \Delta t + \left(\frac{V_1 - V_2}{V_1 + V_2}\right)\left(\frac{\Delta L}{2}\right)$$

A comparison of Eq. (5) with Eq. (2) shows that Eq. (2) is a special case of Eq. (5), i.e., where both the differential displacement $\Delta t$ and the differential line shortening $\Delta L$ are zero. Further, Eq. (5) shows that if Eq. (2) is used where $\Delta t$ and $\Delta L$ are not zero, then a plot of $X_{MEAS}$ versus $X_{DRWN}$, where $X_{DRWN}$ is the corresponding actual value of x, will have a slope of unity, but an intercept, $x_o$ of $$x_o = \Delta t - \left(\frac{V_1 - V_2}{V_1 + V_2}\right)\left(\frac{\Delta L}{2}\right) \quad (6)$$

as illustrated in FIGS. 7 and 8.

The quantity $x_o$ given by Eq. (6) is, in fact, the previously described systematic error, SDSE.

The present invention includes an enhancement to the modified design shown in FIG. 4 that also eliminates SDSE. This enhancement is based on the further realization that SDSE is inherent in certain design rules, i.e., in certain common test structure configurations.

FIG. 9 shows three potentiometer-based test structure configurations that obviate the systematic error quantified in Eq. (5), together with a fourth structure, shown for comparison, which does not. For convenience, the respective configurations are referred to as the ISIS (FIG. 9(a)), YAMA (FIG. 9(b)), MOATS (FIG. 9(c)), and MOATS-X (FIG. 9(d)) designs. Each is to be understood to be disposed at the end of a longer bridge, having a number of dummy taps and two further current pads; i.e., the ISIS structure is an exemplary portion of the entire test structure in FIG. 4. Therefore, these four test structures were compared to determine their relative efficacy as metrological elements for evaluating a series of processing steps, i.e., how accurately a central conductor P1 was placed with respect to two outer conductors, P2 and P3.

The asterisks in the MOATS-X drawing in FIG. 9(d) indicate that, by using a set of three pads comprised either of pads P1, P2, and P3 or of pads P1*, P2*, and P3*, one may optionally perform a measurement equivalent to a measurement performed using the ISIS structure of FIG. 9(a) (described and referred to as ISIS* below).

Figure 9A:
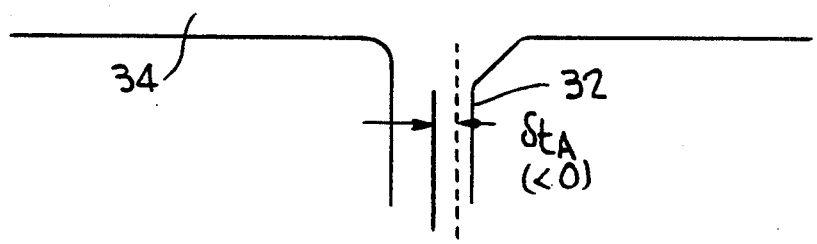
FIGS. 9(a)–(d) provide diagrammatic partial illustrations of four embodiments of test structure architectures according to the invention.
Figure 9A:
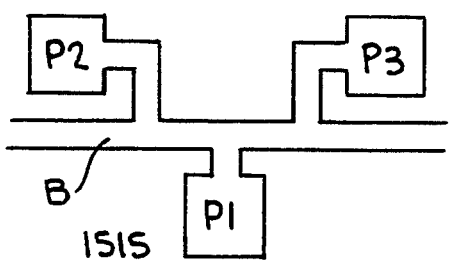
Figure 9B:
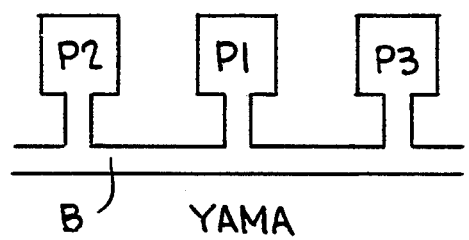
Figure 9C:
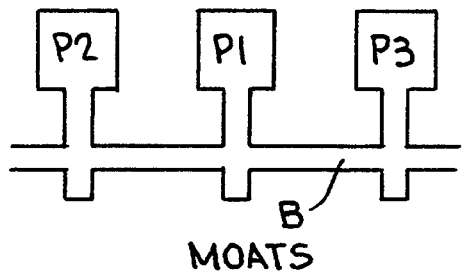
Figure 10:
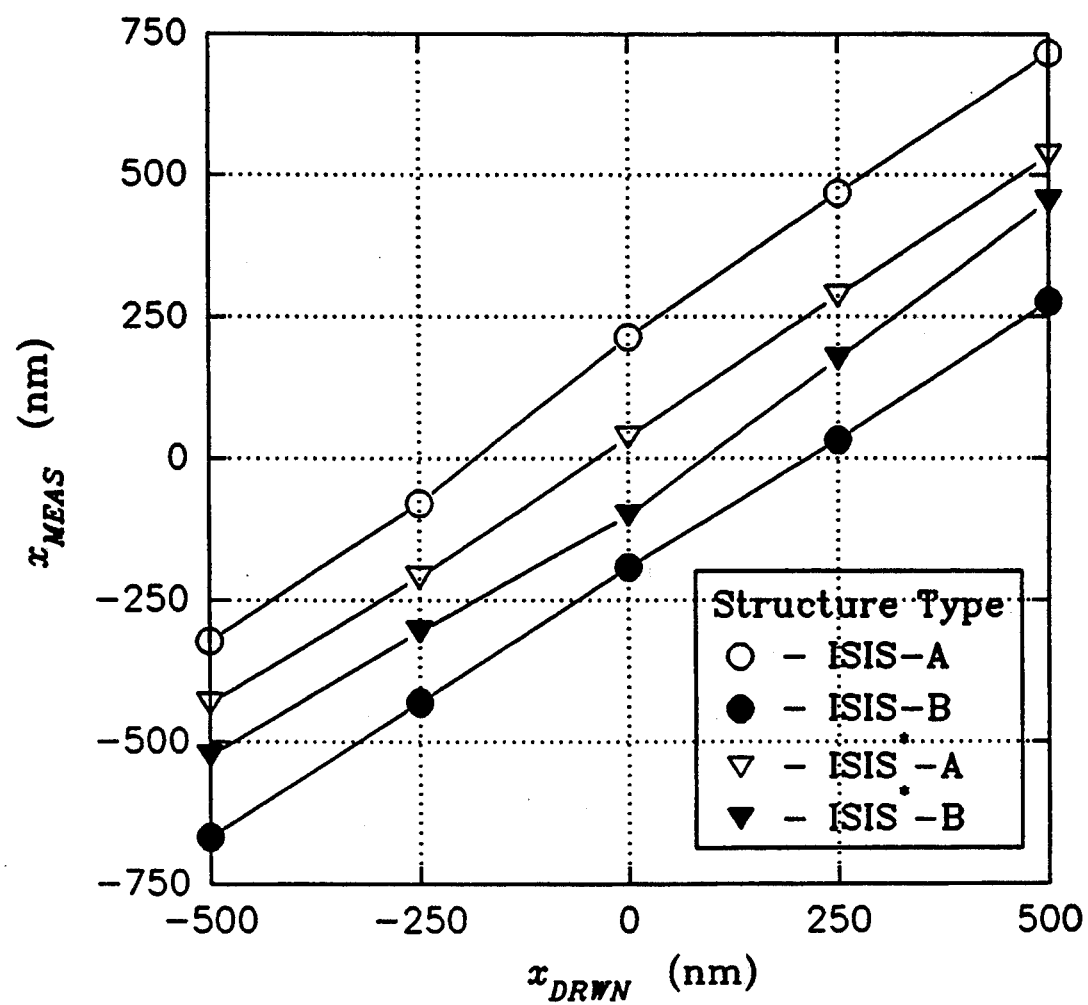
FIG. 10 is a graph comparable to FIG. 7, showing data determined in testing the structure of FIGS. 9(a) and 9(d)

As shown by data reproduced in FIGS. 10 and 11 and discussed below, the ISIS test structure (FIG. 9(a)) comprises essentially the configuration including pads $P_2$, $P_3$ and $P_5$ of FIG. 4, and is subject to the systematic errors (SDSE) discussed above, while the YAMA structure of FIG. 9(b) is not subject to SDSE. Essentially, the distinction between the ISIS and YAMA structures is that the center tap P1 of the ISIS structure is on the opposite side of the bridge B as the end taps $P_2$ and $P_3$, while in the YAMA structure all three taps are on the same side. The surprising result of this difference is that in the YAMA design the differential quantities $\delta t = \delta t_A - \delta t_B$ and $\Delta L = \delta L_A - \delta L_B$ are generally zero, and thus x may be extracted directly from Eq. (2).

The MOATS design is in this respect identical to the YAMA design. The difference between the MOATS and the YAMA designs is the presence in the MOATS design of tap stubs projecting across the bridge B from the voltage taps P1–P3. For applications of the first and second classes, the YAMA and MOATS structures would give essentially the same results. However, for some of the applications of the third class, the MOATS structure is advantageous in terms of manufacturability.

Figure 9D:
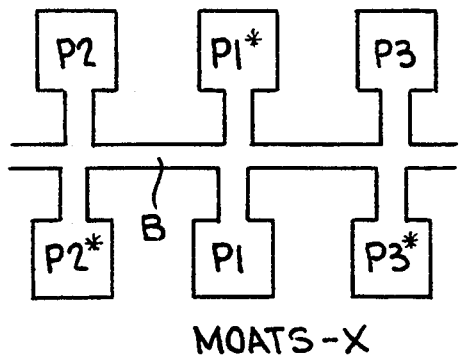

The MOATS-X structure (FIG. 9(d)), is a double-tapped MOATS that, firstly, enables testing of hypotheses relating to an improvement of the ISIS performance, predicted by modeling, when cross-over tap stubs are used; that is, eliminating the effect of nonzero $\delta L = \delta L_A - \delta L_B$ by sampling the MOATS-X in the ISIS* mode (end taps on one side and the center tap on the other) as indicated by asterisks in FIG. 9(d). Secondly, the MOATS-X structure allows measurement of the "noise floor" of the primary pattern generation tool by measuring "exactly" the same offset with MOATS structures extending from opposite sides of a single line. In this context, "noise floor" refers to the uncertainty in the placement of a tap due to noise in the primary pattern generator. While some of this effect is expected to average out, there will be a limit to the perfection of replication of an inside corner.

A composite test structure was designed to facilitate as definitive as possible a comparison of the four test chip configurations. Each composite structure contained two ISIS, two YAMA, and two MOATS configurations, and one MOATS-X configuration. In the ISIS, YAMA, and MOATS configurations, one of each pair of structures was measured from the "A" side of the bridge, while the other was measured from the "B" side. Bridge segments both with and without dummy voltage taps were provided to allow measurement of the bridge electrical length shortening parameters $\delta L$.

For T-junction taps, characteristic of the ISIS and YAMA configurations, the key parameters measured are: $\delta L_A$, the bridge electrical length shortening caused by a tap extending from the "A" side of the bridge, and $\delta L_B$, the bridge electrical length shortening caused by a tap extending from the "B" side of the bridge. For the cross-over taps characteristic of the MOATS and MOATS-X configurations, the corresponding parameters are: $\delta L_{AB-A}$ the bridge electrical length shortening caused by a tap extending from both sides of the bridge but measured from the "A" side of the bridge and $\delta L_{AB-B}$ the bridge electrical length shortening caused by a tap extending from both sides of the bridge, but measured from the "B" side of the bridge.

Multiple examples of this composite test structure were located on a single test chip. Bridge lengths, L, were 8 and 12 μm. Bridge linewidths, $W_B$, were 1 and 2 μm, and tap linewidths, $W_T$, were 1, 2, and 4 μm. The built-in offsets, $X_{DRWN}$, were ±0.50, ±0.25, and 0.0 μm. The test chip was printed on a 10X master chrome mask by an electron pattern generator system with a 0.1 μm by 0.1 μm pixel size. The master was then stepped across two bright chrome masks, at 10 X reduction and 10-mm stepping distances with an optical tool.

The data reported herein are extracted from the structures with L=12 μm, $W_T$=2 μm, and $W_B$=1 μm. Data were taken from five composite structures (one exhibiting each value of $X_{DRWN}$) at two orientations, hereafter referred to as vertical and horizontal, and four chip sites on each of the two substrates, for a total of 80 composite structures. The structures were tested by forcing a test current through the bridge and measuring voltages at appropriate pads tapping into the bridge along its length.

The effective shortening of the length of the bridge segment per voltage tap, δL, was calculated following the following procedure. A voltage drop $V_1$ is measured across a first segment of the bridge having no intermediate taps, and of length $L_1$, where $L_1$ is the center-to-center separation of the corresponding voltage taps. The voltage drop $V_2$ induced by the same bridge current across a companion pair of taps with center-to-center spacing $L_2$ (equal to $L_1$) defining a second bridge segment is likewise measured, the second bridge segment having a number n of "dummy" voltage taps, such as shown at 36 in FIGS. 4. To ensure that proximity effects do not adversely affect the measurements, the spacing of the "dummy" taps is chosen to be L/2; that is, the spacing of the dummy taps was equal to one-half the length L of the third segment of the bridge 34 between the taps and connecting pads P2 and P3 to the bridge B, i.e., defining the end-tap-to-center-tap spacing of the potentiometer structure. For the extraction of δL to properly apply to the active region of the potentiometer, the design linewidths of the taps and the bridge are equal throughout.

For a constant current along the bridge, δL is then calculated using the expression $$\delta L = \left( \frac{L_1 V_2 - L_2 V_1}{n V_1 + (V_1 - V_2)} \right) \quad (7)$$

where: $V_1$ is the voltage between the center pad $P_1$ and one end pad $P_2$; $V_2$ is the voltage between $P_1$ and the opposite end and $P_3$; and n is the number of dummy taps. As mentioned previously, four different values of δL may be extracted in this way: $\delta L_A$, $\delta L_B$, $\delta L_{AB-A}$, and $\delta_{AB-B}$, by appropriate choice of the connecting pads.

The offset $X_{MEAS}$ of the structure was measured in two ISIS configurations (those which the model predicts are vulnerable to systematic errors due to asymmetrical ICR), namely, the simple ISIS, shown in FIGS. 4 and 9(a), and the ISIS* defined by the asterisked pads on the MOATS-X configuration of FIG. 9(d). Values of $X_{MEAS}$, calculated from Eq. (3) for a single composite structure on one chip, are shown for the ISIS and ISIS, structures (each having been produced in "A" and "B" examples, as indicated) in FIG. 10. The values of $X_{MEAS}$ were determined by setting Δt=0, in lieu of its precise value which is not known, while using the appropriate values of ΔL. The improvement afforded simply by the cross-over taps in ISIS, is clearly achieved, in that the y-intercept of the curve of $X_{MEAS}$ versus $X_{DRWN}$ (which ideally should be zero) is substantially reduced for the ISIS* data as compared to the ISIS data shown; however, also as expected, even the ISIS* configuration does not entirely eliminate the systematic error represented by the y-intercept, due to placement of the central tap $P_1$ on the opposite side of the bridge from the end taps $P_2$ and $P_3$.

To measure an unknown offset using either ISIS or ISIS*, one must still first determine by measurement the intercept of the curve of $X_{MEAS}$ versus $X_{DRWN}$, that is, essentially the quantity $x_o$ in Eq. (6). This serves as a calibration, allowing subsequent employment of Eq. (4) (for example) to determine the unknown value of x of another, separate, test structure. However, neither the ISIS nor the ISIS* configurations are satisfactory for determining unknown x values. This is because the electron beam spot size causes an uncertainty in the placement of the features of at least ±10 nm affecting the output of the primary pattern generator and resulting in an uncertainty in the value of $X_{DRWN}$.

The YAMA and MOATS structures, wherein the central tap is on the same side of the bridge as the end taps, avoid this problem. Data comparable to that provided for the ISIS and ISIS* structures in FIG. 10 is presented for the YAMA and MOATS structures in FIG. 11. Again, two examples ( "A" and "B") were tested. The y-intercepts of the curves of $X_{MEAS}$ versus $X_{DRWN}$ are of the order of only 15 nm, consistent with the uncertainty in feature placement by the primary pattern generation tool.

Figure 11:
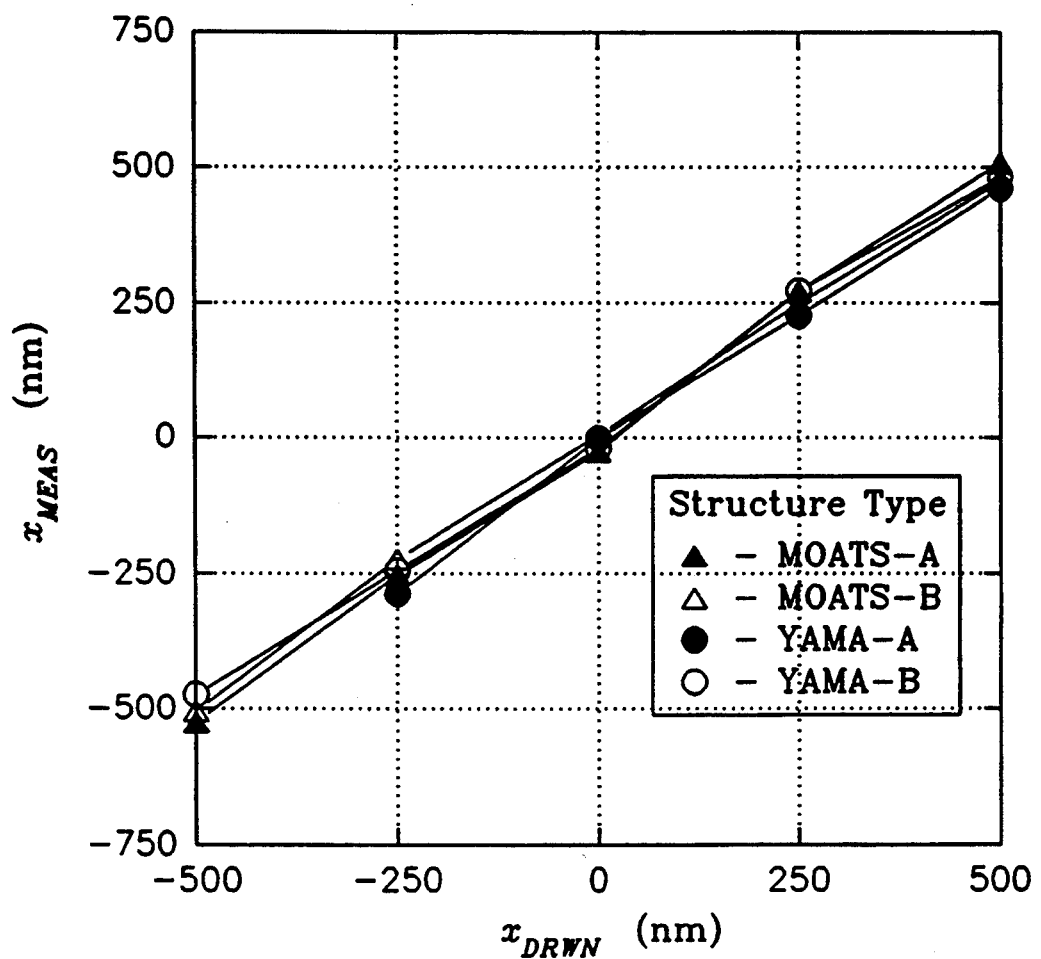
FIG. 11 is a graph comparable to FIG. 10, showing data determined in testing the structures of FIGS. 9(b) and (c).

In practical applications, therefore, the YAMA and MOATS configurations are preferred over the ISIS structure; as the systematic error is eliminated as shown by FIG. 11, the need for determination of $x_5$ for calibration purposes as described above is eliminated.

Measurements from the two different sides of the same MOATS-X structure were also compared. If the primary pattern generator were able to create geometrically perfect voltage-tap cross-overs, then the same value of x for voltages measured from either side of the structure should be obtained because the ΔLs on opposite sides of the wires would be equal, and Δt and δt would be zero. Furthermore, since the same physical offset is being measured along the same length of the same bridge, there is no possibility that variations in the width of the bridge and/or of the taps would introduce spurious values of the offset. Therefore, the two measurements should give exactly the same results.

Experiment indicates that, for all sites and for all structures, the differences between measurements of the same offset x, as measured using voltage taps on the two opposite sides of the bridge, was only 7±6 nm. The value of 7 nm included instrumental error, which should be reducible through improved measurement technique, and is responsive to random patterning errors that limit the baseline capabilities of this structure for a particular fabrication technique to a minimum value estimated to be 5 nm.

Thus, there has been shown and described an improved process and electrical test structure for submicrometer feature metrology which accomplishes all of the objects of the invention mentioned above.

While the invention has been described with a certain degree of particularity and with respect to certain preferred embodiments thereof, it is manifest that many changes may be made in the details of construction and the arrangement of components without departing from the spirit and scope of the disclosure. It is understood that the invention is not limited to the embodiments set forth herein, but is to be limited only by the scope of the appended claims including the full range of equivalency to which each element thereof is entitled.

We claim:

1. A method for determining the relative spacing of a center tap connected to a bridge conductor with respect to a pair of taps, said pair of taps terminating a third segment of a length of said bridge conductor comprising at least three segments, and for compensating measurements of said segments of the length of the bridge conductor made by forcing a current to flow between the ends of said length of the bridge conductor and measuring the voltages across taps disposed at respective ends of said segments for effective length reduction of said segments due to the presence of conductive taps intersecting said segments of the bridge conductor, said method comprising the steps of:

providing a test structure on an insulating substrate, said test structure comprising a length of said bridge conductor effectively divided into three nonoverlapping segments by intermediate taps having pads connected thereto for measurement of voltages across said three segments, a first segment of said bridge conductor having no taps disposed between its ends, a second segment having a plurality of dummy taps not connected to pads employed for voltage measurement disposed between its ends, and a third segment having had a center tap applied to said bridge conductor disposed between taps at the ends of the third segment;

forcing a current along said bridge conductor and measuring a first voltage $V_1$ between pads connected to said taps at the ends of said first segment of said bridge conductor;

forcing a current along said bridge conductor and measuring a second voltage $V_2$ between pads connected to said taps at the ends of said second segment of said bridge conductor;

comparing $V_1$ and $V_2$ to measure a relative conductor-shortening effect caused by the presence of said dummy taps in said second segment of said bridge conductor;

forcing a current to flow along said bridge conductor and measuring a third voltage $V_3$ between a pad connected to a first tap at a first end of said third segment of said bridge conductor, and a pad connected to said center tap;

forcing a current along said bridge conductor and measuring a fourth voltage $V_4$ between a pad connected to a second tap at a second end of said third segment of said bridge conductor, and said pad connected to said center tap; and comparing $V_3$ and $V_4$ to determine a relative offset x of said center tap from a nominal central position between said first and second taps at the ends of said third segment of said bridge conductor.

2. The method of claim 1, wherein said relative conductor-shortening effect is represented by $\delta L$, where $L_1$ is the length of said first segment of the bridge conductor, $L_2$ is the length of said second segment of the bridge conductor, and $\delta L$ is calculated responsive to the following expression:

$$\Delta L = \left( \frac{L_1 V_2 - L_2 V_1}{(n+1) \cdot V_1 - V_2} \right)$$

and wherein n is the number of dummy taps.

3. The method of claim 2, wherein $L_3$ is the length of said third segment of said bridge conductor, and said offset x is calculated responsive to the following expression:

$$x = \left( \frac{V_3 - V_4}{V_3 + V_4} \right) \left( \frac{L_3 - 2\Delta L}{2} \right).$$

4. The method of claim 1, wherein each of said center tap and said first and second taps at the ends of said third segment of said bridge conductor are disposed on the same side of said bridge conductor.

5. A method for compensating measurements of the length of segments of a bridge conductor made by forcing a current to flow along said bridge conductor and measuring the voltages across the ends of said segments of said bridge conductor for effective length reduction due to the presence of conductive taps intersecting said segments of the bridge conductor, said method comprising the steps of:

providing a conductive test structure on an insulative substrate, said test structure comprising a bridge conductor effectively divided into at least two nonoverlapping segments by intermediate taps having pads connected thereto, a first segment of said bridge conductor having no taps intermediate its ends, and a second segment having one or more dummy taps not connected to pads employed herein for voltage measurement intermediate its ends;

forcing a current along said bridge conductor, and measuring a first voltage $_1$ across pads connected to said taps at the ends of said first segment of said bridge conductor;

forcing a current along said bridge conductor, and measuring a second voltage $V_2$ across pads connected to said taps at the ends of said second segment of said bridge conductor;

comparing $V_1$ and $V_2$ to determine a relative segment-shortening effect caused by the presence of said dummy taps in said second segment of said bridge conductor; and compensating measurements of the lengths of said first and second segments responsive to said determined relative segment-shortening effect.

6. The method of claim 5, wherein said relative segment-shortening effect is represented by $\delta L$, where $L_1$ is the length of said first segment of the bridge conductor, $L_2$ is the length of said second segment of the bridge conductor, and $\delta L$ is calculated responsive to the following expression:

$$\Delta L = \left( \frac{L_1 V_2 - L_2 V_1}{(n+1) \cdot V_1 - V_2} \right)$$

and wherein n is the number of dummy taps.

* * * * *